US012007234B2

(12) United States Patent
Trinidad et al.

(10) Patent No.: US 12,007,234 B2
(45) Date of Patent: Jun. 11, 2024

(54) MAGNITUDE CALCULATION IN A MAGNETIC FIELD ANGLE TRACKING SYSTEM

(71) Applicant: Allegro MicroSystems, LLC, Manchester, NH (US)

(72) Inventors: Cristian Trinidad, Buenos Aires (AR); Nicolás Rigoni, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 459 days.

(21) Appl. No.: 17/505,715

(22) Filed: Oct. 20, 2021

(65) Prior Publication Data

US 2023/0123243 A1   Apr. 20, 2023

(51) Int. Cl.
  G01B 7/30   (2006.01)
  G01R 33/07  (2006.01)
  G06F 7/544  (2006.01)

(52) U.S. Cl.
  CPC ............. G01B 7/30 (2013.01); G01R 33/072 (2013.01); G06F 7/5446 (2013.01)

(58) Field of Classification Search
  CPC ...... G01B 7/30; G01B 9/0207; G01R 33/072; G01R 33/077; G01R 33/09; G01R 33/091; G01R 33/0082; G01R 33/02; G01R 33/0035; G01R 33/0041; G01R 33/0017; G01R 33/0029; G01R 35/00; G01R 33/0094; G06F 7/5446; G01D 3/036; G01D 5/145; G01D 5/24471; G01D 5/24476; G01D 5/2448; G01D 5/3473; G01D 5/142
  See application file for complete search history.

(56) References Cited

U.S. PATENT DOCUMENTS

| 10,884,092 B2 | 1/2021 | Rigoni et al. |
| 2017/0356966 A1* | 12/2017 | Romero ................. G01R 33/06 |
| 2020/0088546 A1* | 3/2020 | Sirohiwala ............. G01D 5/145 |
| 2021/0156665 A1* | 5/2021 | Ausserlechner ..... G01D 5/2086 |
| 2022/0357144 A1 | 11/2022 | Tombez |

OTHER PUBLICATIONS

U.S. Appl. No. 17/501,120, filed Oct. 14, 2021, Lutz.
U.S. Appl. No. 17/112,107, filed Dec. 4, 2020, Deligiannis et al.
Bartik et al. "Angle Tracking Observer for the Velocity Estimation with the Filtered Control Variable", Science Direct, IFAC Papers online 52-27, 2019, 6 pages.

* cited by examiner

*Primary Examiner* — Son T Le
*Assistant Examiner* — Matthew W. Baca
(74) *Attorney, Agent, or Firm* — Daly, Crowley, Mofford & Durkee, LLP (57) ABSTRACT

A magnetic field sensor configured to sense an angle of a magnetic field associated with a rotatable target includes a first magnetic field sensing structure configured to generate a first signal indicative of the magnetic field and a second magnetic field sensing structure configured to generate a second signal indicative of the magnetic field, wherein the first and second magnetic field sensing structures are configured to detect quadrature components of the magnetic field. A controller responsive to the first and second signals includes an angle tracking observer having a sine block and a cosine block operatively coupled to compute the angular position of the target using a control loop based in part on a non-orthogonality error term and a magnitude calculator that uses the sine block and the cosine block to compute a magnitude of the magnetic field.

29 Claims, 3 Drawing Sheets

MAGNITUDE CALCULATION IN A MAGNETIC FIELD ANGLE TRACKING SYSTEM

CROSS REFERENCE TO RELATED APPLICATIONS

Not Applicable.

STATEMENT REGARDING FEDERALLY SPONSORED RESEARCH

Not Applicable.

FIELD

This disclosure relates generally to magnetic field sensors and, more particularly, to magnetic field magnitude calculation in an angle tracking system.

BACKGROUND

As is known, sensors are used to perform various functions in a variety of applications. Some sensors include one or more magnetic field sensing elements, such as a Hall effect element or a magnetoresistive element or a pickup coil, to sense a magnetic field associated with proximity or motion of a target object, such as a magnetic or a ferromagnetic object in the form of a gear or ring magnet, or to sense a current, as examples. The signal or signals generated by one or more magnetic field sensing elements can be processed by respective signal paths that can be referred to as channels in order to generate one or more sensor output signals indicative of a parameter associated with the target, such as an angular position, a speed of rotation, and/or a direction of rotation of the target as examples.

Some sensors include two or more magnetic field sensing elements. For example, a magnetic field angle sensor can have multiple sensing elements to detect an angular position of a rotating magnet. In order to accurately detect a magnetic field, the magnetic field sensing elements may need to be aligned, not only with respect to the magnetic field that they sense, but also with respect to each other. If magnetic field sensing elements are individual components, they may be placed (e.g. on a printed circuit board) so that they are aligned. As another example, if the magnetic field sensing elements are part of a semiconductor die, they may be formed on or as part of the semiconductor die so that they are aligned. Misalignment of magnetic field sensing elements can introduce errors in the output signals of the magnetic field sensor, reducing accuracy of the sensor.

In some applications, such as in magnetic field angle sensing, it may be required that signals generated by different sensing elements be in quadrature such that one element generates a sine signal and the other generates a cosine signal from which a rotational angle of the target can be determined, such as by using CORDIC processing. Non-orthogonality of the signals may result, for example, from misalignment of the elements among other causes.

SUMMARY

Described herein is a magnetic field sensor including an angle tracking observer to compute an angle associated with a rotatable target and a magnitude calculator to calculate a magnitude of the magnetic field. Processing elements, including sine and cosine processing blocks, are used in both the angle tracking observer and in the magnitude calculator thereby advantageously reducing processing elements and/or requirements. Further, use of an angle signal computed with the angle tracking observer to then compute the field magnitude can eliminate certain error in the computed magnitude.

According to the disclosure, a magnetic field sensor configured to sense an angle of a magnetic field associated with a rotatable target includes a first magnetic field sensing structure configured to generate a first signal indicative of the magnetic field and a second magnetic field sensing structure configured to generate a second signal indicative of the magnetic field, wherein the first and second magnetic field sensing structures are configured to detect quadrature components of the magnetic field. A controller configured to process the first and second signals to determine an angular position of the target and a magnitude of the magnetic field includes an angle tracking observer and a magnitude calculator. The angle tracking observer includes a sine block and a cosine block operatively coupled to compute the angular position of the target using a control loop based in part on a non-orthogonality error term and the magnitude calculator includes the sine block and the cosine block operatively coupled to compute the magnitude of the magnetic field.

Features may include one or more of the following individually or in combination with other features. The magnitude calculator is configured to compute: $A_{proposed}=x^*\cos((\varphi^*)+y^*\sin(\varphi^*+\beta^*))$, where x is the first signal, y is the second signal, $\varphi^*$ is the computed angular position of the target, and $\beta^*$ is the non-orthogonality term. The computed magnitude of the magnetic field can be based in part on a constant that is indicative of a cosine of an error term. The controller can be further configured to remove the constant from the computed magnitude. In some embodiments, the non-orthogonality term can be measured during manufacture and programmed into a memory of the magnetic field sensor. In some embodiments, the non-orthogonality term can be dynamically estimated during operation of the magnetic field sensor. The control loop of the angle tracking observer can be configured iteratively reduce an error given by $error=y^*\cos(\varphi^*+\beta^*)-x^*\sin(\varphi^*)$ where x is the first signal, y is the second signal, $\varphi^*$ is the computed angular position of the target, and $\beta^*$ is the non-orthogonality term.

In embodiments, the rotatable target can include a primary coil coupled to receive an oscillation signal, wherein the first magnetic field sensing structure comprises a first secondary coil electromagnetically coupled to the primary coil and configured to generate the first signal, and wherein the second magnetic field sensing structure comprises a secondary coil electromagnetically coupled to the primary coil and configured to generate the second signal. In embodiments, the first magnetic field sensing structure can include at least one first sensing element configured to generate the first signal and the second magnetic field sensing structure can include at least one second sensing element configured to generate the second signal, wherein the at least one first sensing element and the at least one second sensing element comprise one or more Hall effect elements and/or magnetoresistance elements. The sensor can further include one or both of a diagnostic circuit coupled to receive the computed magnitude of the magnetic field and a compensation circuit coupled to receive the computed magnitude of the magnetic field. The magnetic field sensor can further include an output interface configured to generate one or more output signals of the magnetic field sensor indicative of the computed angular position of the target and the computed magnitude of the magnetic field. The controller can include a CORDIC processor to compute a redundant determination of the angular position of the target.

Also described is a method for determining an angle of a magnetic field associated with a rotatable target including generating a first signal indicative of the magnetic field, generating a second signal indicative of the magnetic field, wherein the first signal and the second signal are indicative of quadrature components of the magnetic field, and providing an angle tracking observer having a sine block and a cosine block operatively coupled to form a control loop based in part on a non-orthogonality error term. The method further includes computing the angle of the magnetic field using the angle tracking observer and computing a magnitude of the magnetic field using the sine block and the cosine block of the angle tracking observer.

Features may include one or more of the following individually or in combination with other features. Computing the magnitude of the magnetic field can inclue using the following equation $A_{proposed} = x^* \cos(\varphi^*) + y^* \sin(\varphi^* + \beta^*)$ where x is the first signal, y is the second signal, $\varphi^*$ is the computed angular position of the target, and $\beta^*$ is the non-orthogonality term. The method can further include removing a constant from the computed magnitude of the magnetic field, wherein the constant is indicative of a cosine of an error term. In embodiments, the method can further include measuring the non-orthogonality term during manufacture and storing the measured non-orthogonality term. In embodiments, the method can further include dynamically estimating the non-orthogonality term during operation of the magnetic field sensor. The control loop of the angle tracking observer can be configured to iteratively reduce an error given by $error = y^* \cos(\varphi^* + \beta^*) - x^* \sin(\varphi^*)$ where x is the first signal, y is the second signal, $\varphi^*$ is the computed angular position of the target, and $\beta^*$ is the non-orthogonality term. The method can further include performing a diagnostic method and/or a compensation method based at least in part on the computed magnitude of the magnetic field. The method can further include generating one or more output signals indicative of the computed angular position of the target and the computed magnitude of the magnetic field.

BRIEF DESCRIPTION OF THE DRAWINGS

The foregoing features of the disclosure, as well as the disclosure itself may be more fully understood from the following detailed description of the drawings, in which like reference numerals identify similar or identical elements.

DETAILED DESCRIPTION

Before describing the present disclosure, some introductory concepts and terminology are explained.

As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Figure 1:
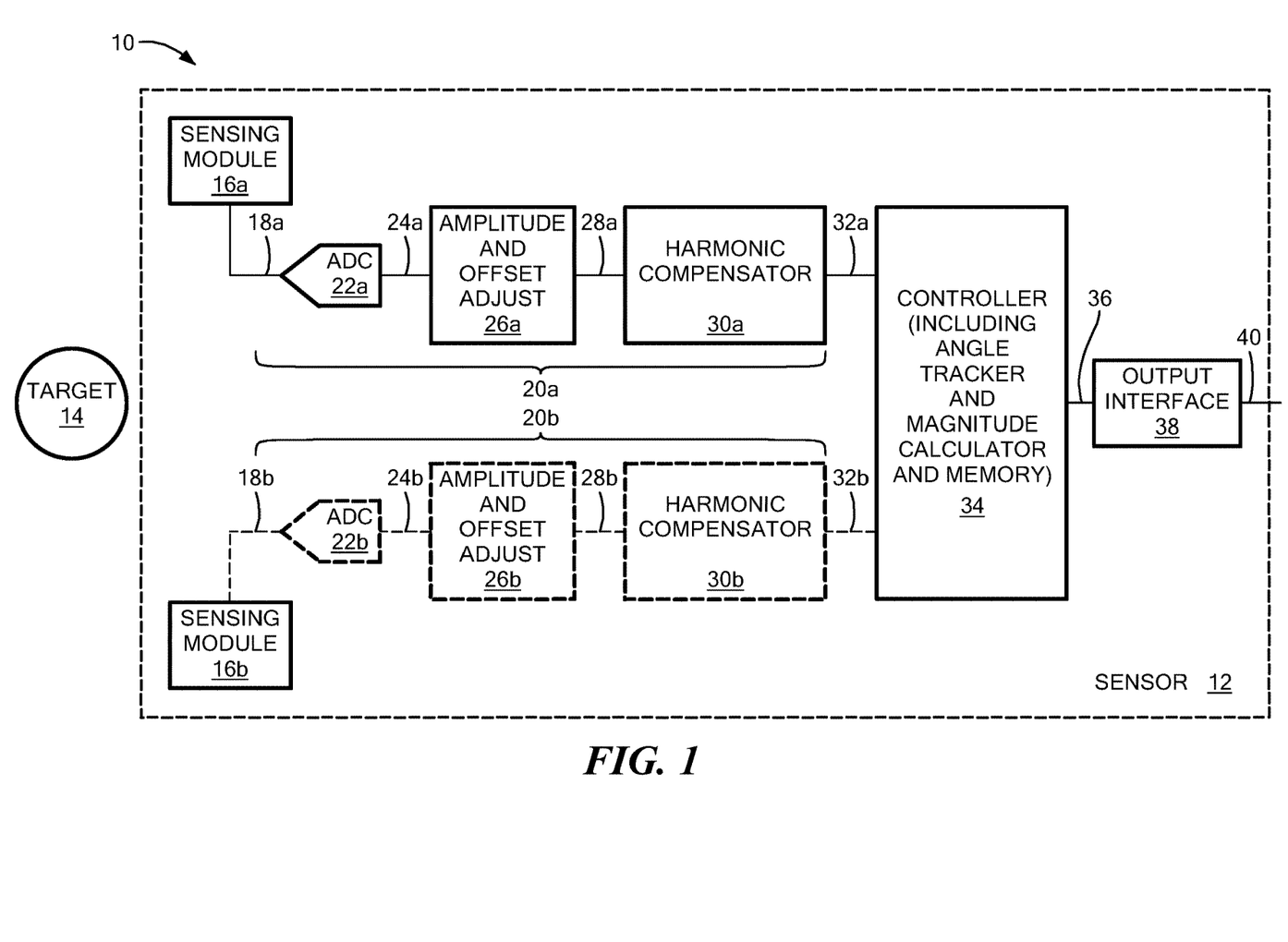
FIG. 1 is a block diagram of a magnetic field sensor including an angle tracking observer and magnetic field magnitude calculation according to the disclosure.

Referring to FIG. 1, a magnetic field sensor system 10 includes a sensor 12 configured to sense a parameter associated with a rotatable target 14 that affects a magnetic field. Sensor 12 includes at least one magnetic field sensing element (e.g., sensing module 18a) that is arranged to generate a signal that is indicative of the magnetic field. The sensor 12 may take various forms, such as an angle sensor configured to detect a magnetic field that is associated with the rotatable target 14 and generate an output signal 40 that is at least in part indicative of the angular position of the target 14. More generally however, sensor 12 can take the form of other types of sensors. Thus, the output signal 40 may indicate one or more of an angular position of the rotating target 14, speed of rotation of the rotating target 14, direction of rotation of the rotating target 14, acceleration of the rotating target 14, and/or any other parameter or characteristic of movement of the rotating target 14.

The rotating target 14 may include one more of a permanent magnet (e.g., a 2-pole magnet or a multi-pole magnet), a gear, a metal object, a rotor of an electric motor, and/or any other suitable type of target. The magnetic field that is associated with the rotating target 14 may include a magnetic field that is generated by the rotating target 14, a magnetic field that is generated by a back bias magnet and modulated by the rotating target 14, a magnetic field that is induced in the rotating target 14 by another magnetic field source, a magnetic field that is generated in a coil that rotates with the target 14, and/or any other suitable type of magnetic field.

Sensor 12 may include a first sensing module 16a, a first signal path or channel 20a, a second sensing module 16b, and a second signal path or channel 20b. Sensor 12 may further include a controller 34 and an output interface 38.

The sensing module 16a may include one or more magnetic field sensing elements. Each of the magnetic field sensing elements may include one or more of a giant magnetoresistor (GMR), a tunnel magnetoresistor (TMR), a Hall effect element, a pickup coil, and/or any other suitable type of magnetic field sensing element. Each of the magnetic field sensing elements in the sensing module 16a may have a first axis of maximum sensitivity. The sensing module 16b may include one or more magnetic field sensing elements. Each of the magnetic field sensing elements may include one or more of a giant magnetoresistor (GMR), a tunnel magnetoresistor (TMR), a Hall effect element, a pickup coil, and/or any other suitable type of magnetic field sensing element. Each of the magnetic field sensing elements in the sensing module 16b may have a second axis of maximum sensitivity that is perpendicular to the first axis of maximum sensitivity. As a result of this arrangement, a signal generated, at least in part, by one of sensing modules 16a-16b may have a sinusoidal waveform, and a signal generated, at least in part, by the other one of sensing modules 16a-16b may have a cosinusiodal waveform, rendering the resulting signals 18a, 18b responsive to orthogonal field components (i.e., in quadrature).

In an example embodiment, sensor 12 can be an inductive rotary sensor in which case sensing modules 16a, 16b can take the form of secondary, or pickup coils and the sensor can include a primary coil coupled to receive an oscillation signal. The primary coil can be coupled to the rotatable target 14 so that the angular position of the target can be sensed by the secondary coils that are electromagnetically coupled to the primary coil. In other words, the electromagnetic coupling between the primary and secondary coils is a function of the target position. In an example embodiment, the target 14 is a metallic, non-ferromagnetic object and the primary coil induces eddy currents in the target, which eddy currents, in turn induce a signal in the secondary coils 16a, 16b. As the target 14 moves (e.g., rotates), the coupling between the primary winding and the secondary windings 16a, 16b changes, so as to thereby encode target position information by way of amplitude modulation of the secondary signals 18a, 18b. It will be appreciated that various mechanical configurations for the target 14 and pickup coils 16a, 16b are possible. For example, the pickup coils 16a, 16b may be external with respect to the remainder of the sensor elements that may be manufactured on an integrated circuit.

The signal paths 20a, 20b can be coupled to receive the signals 18a, 18b generated by the respective sensing modules 16a, 16b and may include various signal conditioning and compensation of possible errors due to sensor-target alignments and design tolerances for example. The signal path 20a may include an analog-to-digital converter (ADC) 22a configured to convert signal 18a into a digital signal 24a and an amplitude and offset adjustment block 26a. The signal path 20b may include an ADC 22b configured to convert signal 18b into a digital signal 24b and an amplitude and offset adjustment block 26b.

The amplitude and offset adjustment blocks 26a, 26b can adjust signal amplitude (i.e., gain) and offset based on temperature variations and other factors to generate respective signals 28a, 28b. To this end, sensor 12 can include a temperature sensor (not shown). Adjusting the gain of the signals 24a, 24b may include multiplying the respective signal by a gain adjustment coefficient as may be stored in memory and offsetting the signals 24a, 24b may include adding an offset adjustment coefficient as may be stored in memory to the respective signal. It will be understood that the present disclosure is not limited to any specific method for adjusting a magnetic field signal based on an offset adjustment coefficient and/or a gain adjustment coefficient.

Harmonic error compensation can be provided by harmonic compensators 30a, 30b that perform harmonic compensation on channel signals 28a, 28b using correction coefficients stored in memory during manufacture in order to thereby remove undesirable harmonics that could adversely affect the sensor output signal 40. In general, the correction coefficients can be considered to represent an estimate of the harmonic error to be removed from the channel signals.

It will be appreciated that a "channel" refers generally to processing circuitry associated with one or more magnetic field sensing elements and configured to generate a respective corrected signal 32a, 32b. As used herein, the term "channel signal" refers to any signal in a channel 20a, 20b that has not undergone harmonic compensation. Thus, in the context of channel 20a for example, signals 18a, 24a, and 28a can be considered channel signals, whereas signal 32a is a compensated, or corrected signal. Similarly, in the context of channel 20b, signals 18b, 24b, and 28b can be considered channel signals, whereas signal 32b is a compensated, or corrected signal. While the particular processing circuitry shown in FIG. 1 to provide a corrected signal 32a includes sensing module 16a, ADC 22a, amplitude and offset adjustment block 26a, and harmonic compensator 30a (and similarly the processing circuitry shown in FIG. 1 to provide corrected signal 32b includes sensing module 16b, ADC 22b, amplitude and offset adjustment block 26b, and harmonic compensator 30b), such channels can include less, more, different, or a different coupling of processing circuitry. Furthermore, while each illustrated channel 20a, 20b has a respective ADC 22a, 22b at the front end of the channel and thus, operates in the digital domain, other configurations are possible.

Controller 34 may include any suitable type of processing circuitry, such as an application-specific integrated circuit (ASIC), a special-purpose processor, synchronous digital logic, asynchronous digital logic, a general-purpose processor (e.g., a MIPS processor, an x86 processor), etc. Controller 34 may also include a memory such as any suitable type of volatile and/or non-volatile memory. By way of example, the memory may include a random-access memory (RAM), a dynamic random-access memory (DRAM), an electrically-erasable programmable read-only memory (EEPROM), and/or any other suitable type of memory.

Controller 34 includes an angle tracker, or angle tracking observer, with which an angle of rotation of the target 14 can be computed based on the first and second corrected signals 32a, 32b, respectively, as described in connection with FIG. 2. In some embodiments, the resulting angle signal can be used by compensators 30a, 30b to select stored coefficients for application to the respective channel signals 28a, 28b. The resulting angle signal can be used to generate the sensor output signal 40.

The controller 34 further includes a magnitude calculator with which a magnitude of the magnetic field can be computed, as is described below in connection with FIG. 3. Suffice it to say here that, according to the disclosure, certain processing blocks of the angle tracking observer are "reused" in the magnitude calculator; or, stated differently, the certain processing blocks are used in both the angle tracking observer and in the magnitude calculator. The resulting field magnitude signal can be used to generate the sensor output signal. Thus controller output signal 36 can represent one or more signal indicative of one or more of target angle and/or field magnitude.

The output interface 38 is responsive to the controller output signal 36 and may include any suitable type of interface for outputting the output signal 40. For example, the output interface 38 may include one or more of a current generator, an Inter-Integrated Circuit (I²C) interface, a Controller Area Network (CAN bus) interface, a Single Edge Nibble Transmission (SENT) interface, Wi-Fi interface, a local-area network interface, a 5G wireless interface, and/or any other suitable type of interface.

Figure 2:
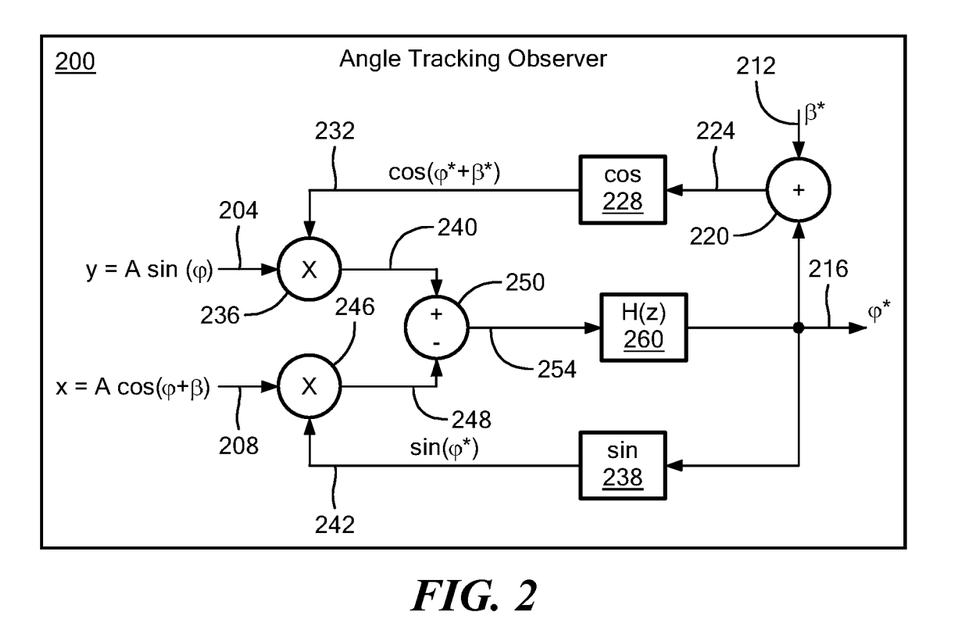
FIG. 2 is a block diagram of an angle tracking observer according to the disclosure.

Referring also to FIG. 2, an example angle tracking observer 200 as can be used in the sensor 12 of FIG. 1 is coupled to receive channel signals 204, 208 as may be the same as or similar to channel signals 32b, 32a of FIG. 1 and thus, which may generally have a quadrature relationship. Signal 204 can be referred to as a y-signal and can be represented by A*sin(φ), where A is the magnitude of the magnetic field and φ is the rotational angle of the target 14. Signal 208 can be referred to as an x-signal and can be represented by A*cos (φ+β), where A is the magnitude of the magnetic field, φ is the rotational angle of the target 14, and p is a non-orthogonality factor that represents the actual error due to any non-orthogonality of signals 204, 208.

The angle tracking observer 200 includes a control loop with which the angular position of the target 14 is computed as φ* 216 in an iterative fashion based in part on a non-orthogonality error term β*. The non-orthogonality error term β* can be generated during manufacture and/or during operational use of the sensor, as will be described.

The angle tracking observer 200 is configured to iteratively reduce an error given by:

$$\text{error} = y^* \cos(\varphi^* + \beta^*) - x^* \sin(\varphi^*) \quad (1)$$

where x is the signal 208, y is the signal 204, φ* is the computed angular position of the target 14, and β* is the non-orthogonality error term. To this end, the observer 200 includes a summation element 220 that is configured to sum the computed angle φ* 216 and the non-orthogonality error term β* to generate a signal 224. The cosine of signal 224 is generated by cosine processing block 228 to generate a signal 232 as shown. A multiplier 236 is configured to multiply the y-signal 204 with the signal 232 to generate a signal 240.

The observer 200 further includes a sine processing block 238 to generate a signal 242 as the sine of the computed angle φ* 216. A multiplier 246 is configured to multiply the x-signal 208 with the signal 242 to generate a signal 248, as shown.

Signal 248 is subtracted from signal 240 by a subtraction element 250 in order to generate a signal 254, as shown. The signal 254 can thus be represented by equation (1). Further compensation processing of signal 254 by block 260 provides the computed angle signal φ* 216. Block 260 implements a transfer function (with a certain frequency response) in order to achieve the desired dynamic response and stability of the observer 200. It will be appreciated by those of ordinary skill in the art that block 260 could be just a Gain term, a proportional integral (PI) controller, or proportional integral derivative (PID) controller, as examples.

By substituting y=A*sin(φ) and x=A*cos (φ+β) into the error expression given by equation (1) above, the error can be represented as follows:

$$\text{error} = A^* \sin(\varphi)^* \cos(\varphi^* + \beta^*) - A^* \cos(\varphi + \beta)^* \sin(\varphi^*) \quad (2)$$

It will be appreciated by those of ordinary skill in the art that if the control loop of the observer 200 is properly trimmed (i.e., if the actual non-orthogonality error β is approximately equal to the non-orthogonality error term β*), then φ≈φ* in steady state.

As an indication of the rotational angle of target 14, signal 216 can be provided to external circuits and systems as sensor output signal 40 (FIG. 1). As noted above, angle signal 216 can also be used for internal compensation, such as by harmonic compensators 30a, 30b (FIG. 1).

The non-orthogonality error term β* 212 can be determined in different ways. As one example, this term can be generated during manufacture of the sensor 12 by measuring the non-orthogonality error in the computed angle and programming the measured error into a memory of the sensor for use by the angle tracking observer 200 during operation. This technique can be well-suited for sensors in which the sensing modules 16a, 16b are integrated (e.g., in an integrated circuit) with the sensor (e.g., in the case of Hall effect elements or magnetoresistance elements). In applications in which the sensing modules 16a, 16b are not integrated with the sensor (e.g., in the case of inductive sensing elements), measurement of the non-orthogonality error may be performed in the application environment and then programmed into the sensor 12 for use by the angle tracking observer 200 during operation.

In some embodiments, the non-orthogonality error term β* 212 can be dynamically determined (i.e., estimated) during operation of the sensor 12. Example apparatus and techniques for such dynamic determination of non-orthogonality error are described in U.S. Pat. No. 10,884,092, entitled "Non-Orthogonality Compensation of A Magnetic Field Sensor", which issued on Jan. 5, 2021 and in co-pending U.S. patent application Ser. No. 17/112,107, entitled "Non-Orthogonality Adjustment Based On A Duty Cycle", which was filed on Dec. 4, 2020, both of which are incorporated herein by reference in their entireties.

It will be appreciated by those of ordinary skill in the art that the above-described angle tracking observer methodology presents an alternative to the use of CORDIC processing. In some embodiments, it may be desirable to additionally provide a CORDIC processor (e.g., as part of the controller 34 of FIG. 1) in order to generate a redundant target angle signal.

Figure 3:
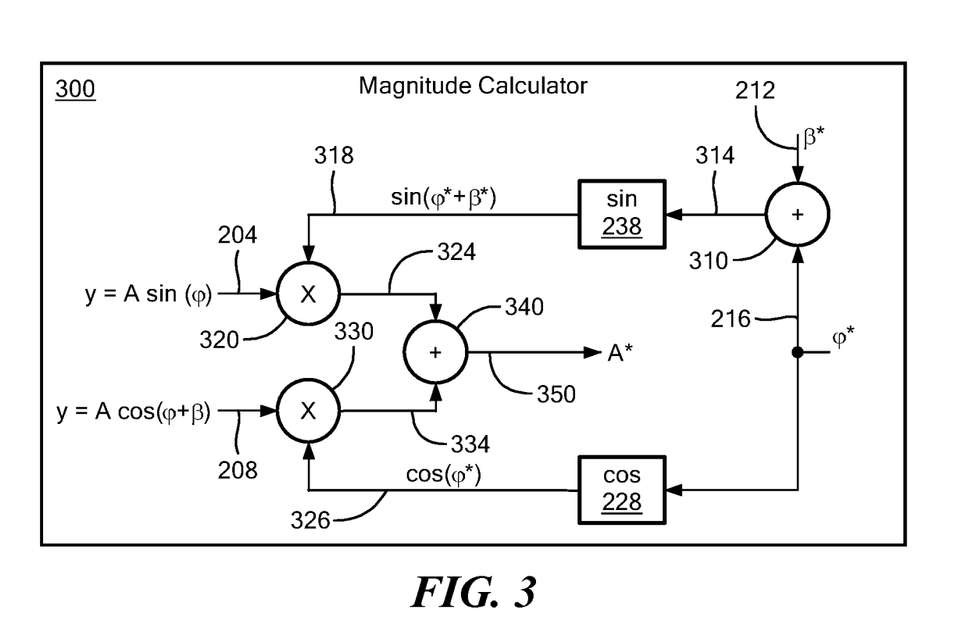
FIG. 3 is a block diagram of a magnitude calculator according to the disclosure.

Referring also to FIG. 3, in which like elements with respect to FIG. 2 are labeled with like reference numbers, a magnitude calculator 300 is provided with which a magnitude of the magnetic field is computed as A* 350. According to the disclosure, magnitude calculator 300 uses some of the same processing blocks as the angle tracking observer 200 and in this way, provides efficiencies in terms of computational elements and/or requirements. For example, magnitude calculator 300 can re-use sine processing block 238 and cosine processing block 228, both of which are also used by the angle tracking observer 200.

Magnitude calculator 300 is configured to compute the magnetic field magnitude 350 as follows:

$$A^* = x^* \cos(\varphi^*) + y^* \sin(\varphi^* + \beta^*) \quad (3)$$

where x is the signal 208, y is the signal 204, φ* is the computed angular position 216 of the target 14, and β* is the non-orthogonality error term 212.

To this end, the magnitude calculator 300 includes a summation element 310 that is configured to sum the computed angle φ* 216 and the non-orthogonality error term β* to generate a signal 314. The sine of signal 314 is generated by sine processing block 238 to provide a signal 318, as shown. A multiplier 320 is configured to multiply the y-signal 204 with the signal 318 to generate a signal 324.

The magnitude calculator 300 further includes cosine processing block 228 to generate a signal 326 as the cosine of the computed angle φ* 216. A multiplier 330 is configured to multiply the y-signal 208 with the signal 326 to generate a signal 334, as shown.

A summation element 340 is coupled to receive and sum signals 324 and 334 in order to generate the computed magnitude signal 350, as shown. Consideration of magnitude calculator 300 and angle tracking observer 200 reveals that sine and cosine processing blocks 238, 228, respectively, are used by both components 300, 200. Furthermore, other processing elements, such as summation elements and multipliers can be used by both the angle tracking observer 200 and the magnitude calculator 300. Both the angle tracking observer 200 and the magnitude calculator 300 are responsive to the non-orthogonality error term $\beta^*$ and the magnitude calculator 300 is coupled to receive the angle signal $\varphi^*$ 216 computed by the observer 200. In these ways, the processing blocks, or elements and signals are advantageously leveraged for use by both components 200, 300.

The magnitude signal 350 can be represented by equation (3) above. By substituting $y=A^*\sin(\varphi)$ and $x=A^*\cos(\varphi+\beta)$ into the magnitude expression given by equation (3), the field magnitude can be represented as follows:

$$A^* = A^*\cos(\varphi+\beta)^*\cos(\varphi^*) + A^*\sin(\varphi)^*\sin(\varphi^*+\beta^*) \quad (4)$$

With the above-described trimming to provide $\beta \approx \beta^*$, as noted above, the computed target angle $\varphi^*$ 216 provides an accurate estimation of the actual target angle $\varphi$ (i.e., $\varphi \approx \varphi^*$). It follows then that:

$$A^* = A^*\cos(\varphi - \varphi^* + \beta) \quad (5)$$

$$A^* = A^*\cos(\beta) \quad (6)$$

Consideration of equation (6) reveals that the computed magnitude A* 350 is affected only by $\cos(\beta)$ which is a constant value and can be calculated at a trimming phase. Accordingly, the constant $\cos(\beta)$ can be removed. For example, controller 34 can be configured to remove this constant term that can be measured and programmed into memory if desired. Removal of the constant term $\cos(\beta)$ can be achieved by multiplying the signal by the inverse of the measured constant value or by dividing the signal by the measured constant value as examples.

Since the magnitude calculator 300 uses as input the angle signal $\varphi^*$ 216 as generated by the tracking observer 200 which observer minimizes error attributable to non-orthogonality, the resulting calculated magnitude A* 350 can be more accurate than magnitude calculations heretofore performed by CORDIC processing. For example, the presence of non-orthogonality error in a CORDIC computation of magnitude can result in undesirable angle modulation that is not present with the above-described magnitude calculation.

Having computed the magnetic field magnitude A* 350, this signal can be provided for use by various on-chip and off-chip functions. For example, the sensor 12 can include various compensation circuitry and/or diagnostic circuitry that can benefit from use of the magnetic field magnitude A* 350. For example, diagnostic circuitry can determine whether safety limits are exceeded based on comparison of the magnetic field magnitude A* 350 to a predetermined threshold. Furthermore, output interface 38 (FIG. 1) can generate sensor output signal 40 as one or more output signals that communicates not only angular position of the target 14, but also field magnitude A* 350, as may be useful in some applications.

Figure 4:
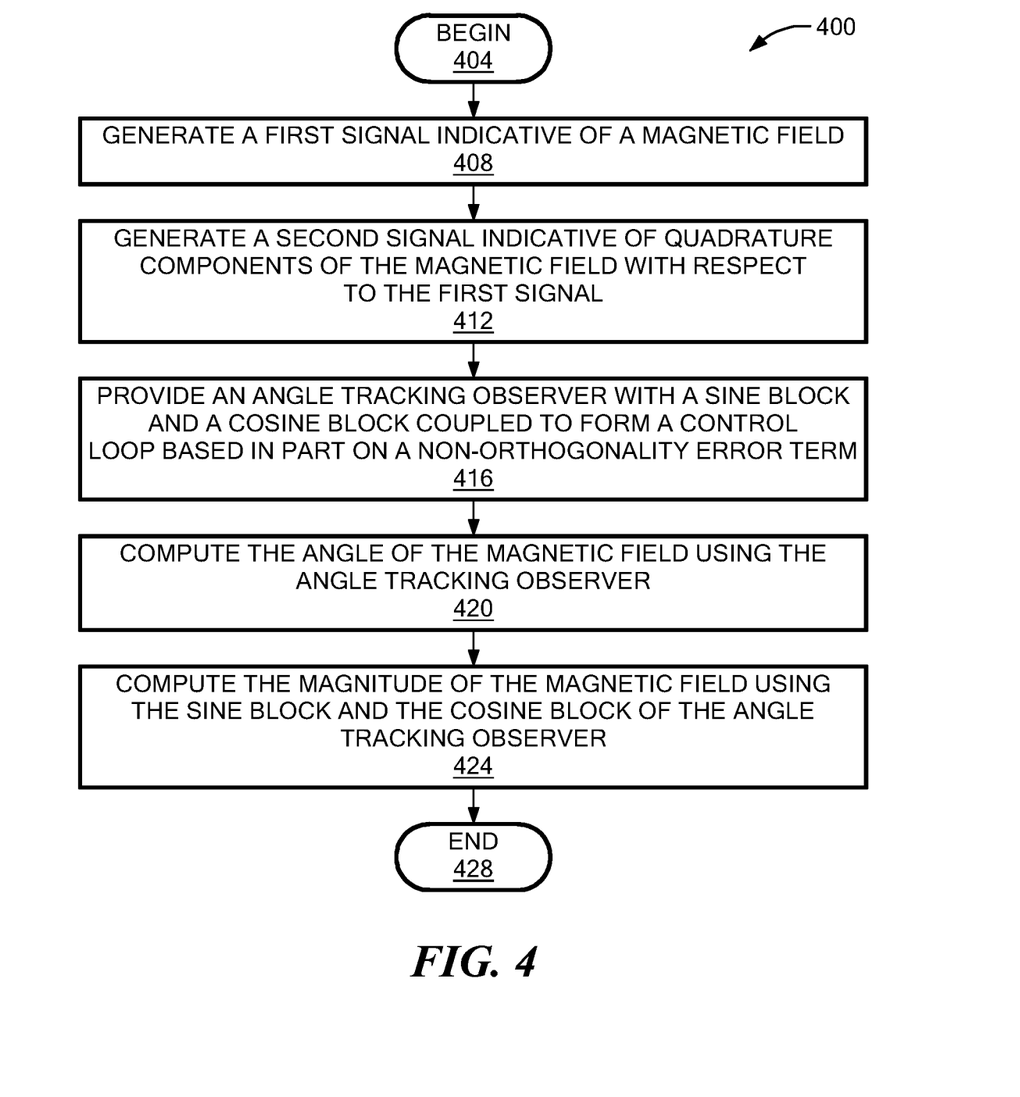
FIG. 4 is a flow diagram illustrating a method of sensing angular position and magnetic field magnitude associated with a target according to the disclosure.

Referring also to FIG. 4, a flow diagram illustrates an example method for determining an angle of a magnetic field associated with a rotatable target. The method commences at block 404, following which a first signal indicative of the magnetic field is generated at block 408. At block 412, a second signal indicative of the magnetic field is generated, with the second signal and the first signal representing quadrature components on the magnetic field. As explained above, generation of such first and second quadrature signals can be achieved by proper placement and/or design of the sensing modules 16a, 16b, such that the resulting signals 18a, 18b are in quadrature.

At block 416, an angle tracking observer is provided having a sine block and a cosine block operatively coupled to form a control loop based in part on a non-orthogonality error term. For example, angle tracking observer 200 is provided with sine block 238 and cosine block 228 as shown in FIG. 2.

The angle of the magnetic field is computed at block 420 using the angle tracking observer 200 (FIG. 2). For example, as explained above, computing the target angle can include iteratively reducing an error given by $y^*\cos(\varphi^*+\beta^*) - x^*\sin(\varphi^*)$.

At block 424, the magnitude of the magnetic field can be computed using the sine block 238 and cosine block 228 (which blocks are also used by the angle tracking observer), following which the method ends at block 428. For example, as explained above, computing the field magnitude can include performing the following computation $A^* = x^*\cos(\varphi^*) + y^*\sin(\varphi^*+\beta^*)$, where x is the signal 208, y is the signal 204, $\varphi^*$ is the computed angular position 216 of the target 14, and $\beta^*$ is the non-orthogonality error term 212.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed is:

1. A magnetic field sensor configured to sense an angle of a magnetic field associated with a rotatable target, comprising:
   a first magnetic field sensing structure configured to generate a first signal indicative of the magnetic field;
   a second magnetic field sensing structure configured to generate a second signal indicative of the magnetic field, wherein the first and second magnetic field sensing structures are configured to detect quadrature components of the magnetic field; and
   a controller configured to process the first and second signals to determine an angular position of the target and a magnitude of the magnetic field, the controller comprising:
      an angle tracking observer comprising a sine block and a cosine block operatively coupled to compute the angular position of the target using a control loop based in part on a non-orthogonality error term; and
      a magnitude calculator comprising the sine block and the cosine block operatively coupled to compute the magnitude of the magnetic field, wherein the magnitude calculator is configured to compute:

$$A_{proposed} = x^*\cos(\varphi^*) + y^*\sin(\varphi^*+\beta^*)$$

where x is the first signal, y is the second signal, $\varphi^*$ is the computed angular position of the target, and $\beta^*$ is the non-orthogonality term.

2. The magnetic field sensor of claim 1, wherein the computed magnitude of the magnetic field is based in part on a constant that is indicative of a cosine of an error term [cos (β)].

3. The magnetic field sensor of claim 2, wherein the controller is further configured to remove the constant from the computed magnitude.

4. The magnetic field sensor of claim 1, wherein the non-orthogonality term is measured during manufacture and programmed into a memory of the magnetic field sensor.

5. The magnetic field sensor of claim 1, wherein the non-orthogonality term is dynamically estimated during operation of the magnetic field sensor.

6. The magnetic field sensor of claim 1, wherein the control loop of the angle tracking observer is configured iteratively reduce an error given by:

$$error = y*\cos(\varphi^* + \beta^*) - x*\sin(\varphi^*)$$

where x is the first signal, y is the second signal, $\varphi^*$ is the computed angular position of the target, and $\beta^*$ is the non-orthogonality term.

7. The magnetic field sensor of claim 1, wherein the rotatable target comprises a primary coil coupled to receive an oscillation signal,
wherein the first magnetic field sensing structure comprises a first secondary coil electromagnetically coupled to the primary coil and configured to generate the first signal, and
wherein the second magnetic field sensing structure comprises a secondary coil electromagnetically coupled to the primary coil and configured to generate the second signal.

8. The magnetic field sensor of claim 1, wherein the first magnetic field sensing structure comprises at least one first sensing element configured to generate the first signal and the second magnetic field sensing structure comprises at least one second sensing element configured to generate the second signal, wherein the at least one first sensing element and the at least one second sensing element comprise one or more Hall effect elements and/or magnetoresistance elements.

9. The magnetic field sensor of claim 1, further comprising one or both of a diagnostic circuit coupled to receive the computed magnitude of the magnetic field and a compensation circuit coupled to receive the computed magnitude of the magnetic field.

10. The magnetic field sensor of claim 1, further comprising an output interface configured to generate one or more output signals of the magnetic field sensor indicative of the computed angular position of the target and the computed magnitude of the magnetic field.

11. The magnetic field sensor of claim 1, wherein the controller further comprises a CORDIC processor to compute a redundant determination of the angular position of the target.

12. A method for determining an angle of a magnetic field associated with a rotatable target, comprising:
generating a first signal indicative of the magnetic field;
generating a second signal indicative of the magnetic field, wherein the first signal and the second signal are indicative of quadrature components of the magnetic field;
providing an angle tracking observer having a sine block and a cosine block operatively coupled to form a control loop based in part on a non-orthogonality error term;

computing the angle of the magnetic field using the angle tracking observer; and
computing a magnitude of the magnetic field using the sine block and the cosine block of the angle tracking observer wherein computing the magnitude of the magnetic field comprises using the following equation:

$$A_{proposed} = x*\cos(\varphi^*) + y*\sin(\varphi^* + \beta^*)$$

where x is the first signal, y is the second signal, $\varphi^*$ is the computed angular position of the target, and $\beta^*$ is the non-orthogonality term.

13. The method of claim 12, further comprising removing a constant from the computed magnitude of the magnetic field, wherein the constant is indicative of a cosine of an error term [cos (β)].

14. The method of claim 12, further comprising measuring the non-orthogonality term during manufacture and storing the measured non-orthogonality term.

15. The method of claim 12, further comprising dynamically estimating the non-orthogonality term during operation of the magnetic field sensor.

16. The method of claim 12, wherein the control loop of the angle tracking observer is configured iteratively reduce an error given by:

$$error = y*\cos(\varphi^* + \beta^*) - x*\sin(\varphi^*)$$

where x is the first signal, y is the second signal, $\varphi^*$ is the computed angular position of the target, and $\beta^*$ is the non-orthogonality term.

17. The method of claim 12, further comprising one or both of performing a diagnostic method or a compensation method based at least in part on the computed magnitude of the magnetic field.

18. The method of claim 12, further comprising generating one or more output signals indicative of the computed angular position of the target and the computed magnitude of the magnetic field.

19. A magnetic field sensor configured to sense an angle of a magnetic field associated with a rotatable target, comprising:
a first magnetic field sensing structure configured to generate a first signal indicative of the magnetic field;
a second magnetic field sensing structure configured to generate a second signal indicative of the magnetic field, wherein the first and second magnetic field sensing structures are configured to detect quadrature components of the magnetic field; and
a controller configured to process the first and second signals to determine an angular position of the target and a magnitude of the magnetic field, the controller comprising:
an angle tracking observer comprising a sine block and a cosine block operatively coupled to compute the angular position of the target using a control loop based in part on a non-orthogonality error term, wherein the control loop of the angle tracking observer is configured iteratively reduce an error given by:

$$error = y*\cos(\varphi^* + \beta^*) - x*\sin(\varphi^*)$$

where x is the first signal, y is the second signal, $\varphi^*$ is the computed angular position of the target, and $\beta^*$ is the non-orthogonality term; and
a magnitude calculator comprising the sine block and the cosine block operatively coupled to compute the magnitude of the magnetic field.

20. The magnetic field sensor of claim 19, wherein the magnitude calculator is configured to compute:

$$A_{proposed} = x^* \cos(\varphi^*) + y^* \sin(\varphi^* + \beta^*)$$

where x is the first signal, y is the second signal, $\varphi^*$ is the computed angular position of the target, and $\beta^*$ is the non-orthogonality term.

21. The magnetic field sensor of claim 20, wherein the computed magnitude of the magnetic field is based in part on a constant that is indicative of a cosine of an error term [cos($\beta$)].

22. The magnetic field sensor of claim 21, wherein the controller is further configured to remove the constant from the computed magnitude.

23. The magnetic field sensor of claim 20, wherein the non-orthogonality term is measured during manufacture and programmed into a memory of the magnetic field sensor.

24. The magnetic field sensor of claim 20, wherein the non-orthogonality term is dynamically estimated during operation of the magnetic field sensor.

25. The magnetic field sensor of claim 19, wherein the rotatable target comprises a primary coil coupled to receive an oscillation signal,
wherein the first magnetic field sensing structure comprises a first secondary coil electromagnetically coupled to the primary coil and configured to generate the first signal, and
wherein the second magnetic field sensing structure comprises a secondary coil electromagnetically coupled to the primary coil and configured to generate the second signal.

26. The magnetic field sensor of claim 19, wherein the first magnetic field sensing structure comprises at least one first sensing element configured to generate the first signal and the second magnetic field sensing structure comprises at least one second sensing element configured to generate the second signal, wherein the at least one first sensing element and the at least one second sensing element comprise one or more Hall effect elements and/or magnetoresistance elements.

27. The magnetic field sensor of claim 19, further comprising one or both of a diagnostic circuit coupled to receive the computed magnitude of the magnetic field and a compensation circuit coupled to receive the computed magnitude of the magnetic field.

28. The magnetic field sensor of claim 19, further comprising an output interface configured to generate one or more output signals of the magnetic field sensor indicative of the computed angular position of the target and the computed magnitude of the magnetic field.

29. The magnetic field sensor of claim 19, wherein the controller further comprises a CORDIC processor to compute a redundant determination of the angular position of the target.

* * * * *

UNITED STATES PATENT AND TRADEMARK OFFICE
CERTIFICATE OF CORRECTION

PATENT NO. : 12,007,234 B2
APPLICATION NO. : 17/505715
DATED : June 11, 2024
INVENTOR(S) : Cristian Trinidad et al.

It is certified that error appears in the above-identified patent and that said Letters Patent is hereby corrected as shown below:

In the Specification

Column 2, Line 28 delete "$cos((\varphi*)$" and replace with --$cos(\varphi*)$--.

Column 4, Line 36 delete "18a" and replace with --16a--.

Column 7, Line 18 delete "p" and replace with --$\beta$--.

Column 7, Line 29 delete "$error = y* cos(\varphi* + \beta*) - x* sin(\varphi*)$" and replace with --$y * cos(\varphi* + \beta*) - x * sin(\varphi*)$--.

Column 7, Line 60 delete "$error = A* sin(\varphi)* cos(\varphi* + \beta*) - A*cos(\varphi + \beta)* sin(\varphi*)$" and replace with --$error = A * sin(\varphi) * cos(\varphi* + \beta*) - A * cos(\varphi + \beta) * sin(\varphi*)$--.

Column 8, Line 52 delete "$A^* = x* cos(\varphi*) + y*sin(\varphi* + \beta*)$" and replace with --$A^* = x * cos(\varphi*) + y * sin(\varphi* + \beta*)$--.

Column 9, Line 21 delete "$A^* = A* cos(\varphi + \beta) * cos(\varphi*) + A*sin(\varphi)*sin(\varphi* + \beta*)$" and replace with --$A^* = A * cos(\varphi + \beta) * cos(\varphi*) + A * sin(\varphi) * sin(\varphi* + \beta*)$--.

Column 9, Line 26 delete "$A^* = A*cos(\varphi - \varphi* + \beta)$" and replace with --$A^* = A * cos(\varphi - \varphi* + \beta)$--.

Column 9, Line 28 delete "$A^* = A*cos(\beta)$" and replace with --$A^* = A * cos(\beta)$--.

In the Claims

Column 10, Line 64 delete "$A_{proposed} = x* cos(\varphi*) + y*sin(\varphi* + \beta*)$" and replace with --$A_{proposed} = x * cos(\varphi*) + y * sin(\varphi* + \beta*)$--.

Signed and Sealed this
Eleventh Day of February, 2025

Coke Morgan Stewart
*Acting Director of the United States Patent and Trademark Office*

Column 11, Line 18 delete "$error = y* \, cos(\varphi* + \beta*) - x* \, sin(\varphi*)$" and replace with --$error = y * cos(\varphi* + \beta*) - x * sin(\varphi*)$--.

Column 12, Line 8 delete "$A_{proposed} = x* \, cos(\varphi*) + y*sin\,(\varphi* + \beta*)$" and replace with --$A_{proposed} = x * cos(\varphi*) + y * sin\,(\varphi* + \beta*)$--.

Column 12, Line 26 delete "$error = y* \, cos(\varphi* + \beta*) - x* \, sin(\varphi*)$" and replace with --$error = y * cos(\varphi* + \beta*) - x * sin(\varphi*)$--.

Column 12, Line 61 delete "$error = y* \, cos(\varphi* + \beta*) - x* \, sin(\varphi*)$" and replace with --$error = y * cos(\varphi* + \beta*) - x * sin(\varphi*)$--.